US005844434A

United States Patent [19]

Eschauzier

[11] Patent Number: 5,844,434

[45] Date of Patent: Dec. 1, 1998

[54] START-UP CIRCUIT FOR MAXIMUM HEADROOM CMOS DEVICES

[75] Inventor: Rudolphe Gustave Eschauzier, Santa Clara, Calif.

[73] Assignee: Philips Electronics North America Corporation, New York, N.Y.

[21] Appl. No.: 842,344

[22] Filed: Apr. 24, 1997

[51] Int. Cl.[6] .................... H03L 7/00

[52] U.S. Cl. .................... 327/143; 327/198; 327/538; 327/546

[58] Field of Search .................... 327/142, 143, 327/198, 530, 538, 543, 546

[56] References Cited

U.S. PATENT DOCUMENTS 5,751,182 5/1998 Thiel .................... 327/142

*Primary Examiner*—Timothy P. Callahan
*Assistant Examiner*—Jeffrey Zweizig
*Attorney, Agent, or Firm*—Steven R. Biren

[57] ABSTRACT

The invention entails a circuit that enables maximum headroom cascode biasing schemes to locally generate all the required voltage from a single reference current. This leads to a considerable die size reduction compared to existing circuits, which require two reference currents. Single reference current biasing is achieved by a start-up circuit that overcomes the zero-current steady-state bias solution that would normally occur when attempting to bias a maximum headroom CMOS cascode biasing schemes from a single input current. The start-up circuit is extremely simple and does not counteract the die area advantage of the biasing set-up, nor does it affect its other virtues, including high isolation from one current source to another and robustness against lot-to-lot process variations.

6 Claims, 6 Drawing Sheets

START-UP CIRCUIT FOR MAXIMUM HEADROOM CMOS DEVICES

BACKGROUND OF THE INVENTION

1. Field of the Invention

This invention relates to the design of circuits which provide controlled biasing voltages and current sources to other circuits. It is particularly applicable to biasing circuits within an Integrated Circuit (IC), and specifically to CMOS Integrated Circuits requiring cascode biasing schemes, such as CMOS analog devices.

2. Discussion of Related Art

Integrated circuits typically comprise blocks of circuitry, each block performing a particular function, with each block comprising sub-circuits to accomplish that function. The distribution of current to each of these blocks and sub-circuits, particularly in CMOS analog designs, is accomplished by a cascode biasing scheme. The purpose of the cascode biasing circuitry is to provide each sub-circuit an independent current source, without requiring excessive area on the die forming the IC. Ideally, one reference current source would be provided on the IC chip, and the cascode biasing circuitry would distribute this current in such a manner that each sub-circuit would operate as if it were directly connected to this reference source. Traditionally, the reference current source will be routed, via metal routes, to each block of the design; within each block, a cascode biasing circuit then distributes the current to each of its subcircuits, independently.

FIG. 1 shows a traditional cascode biasing circuit, which will be discussed in detail in the description of the preferred embodiment. The shown transistor configuration derives current sources 111 (111A, 111B, etc.) from the reference current source 110, and provides this current to the subcircuits within the overall circuit block. This circuit exhibits two undesirable characteristics: the biasing of the transistors 150 (150A, 150B, etc.) limits the voltage range of the subcircuits, and, the derived current sources exhibit undesirable cross-coupling.

The voltage range of a device, or subcircuit, is the range of input voltages for which the device operates properly; this range is commonly referred to as the "headroom" of the device. Preferably, the headroom of a device should encompass both the positive and negative supply voltages, commonly referred to as the headroom extending from "rail to rail". The circuit of FIG. 1 does not enable rail to rail operation, because of the bias potential of transistors 150, as will be discussed with reference to FIG. 2.

The derived current sources of FIG. 1 exhibit cross-coupling, due to the particular configuration of controlling transistors 120 and 130. A voltage change caused by the subcircuit associated with one of the derived current sources will induce a current change in the other derived current sources. Preferably, each of the derived current sources should maintain a constant current, independent of the other current sources, so that each subcircuit can operate effectively.

FIG. 3 shows a traditional cascode biasing circuit which overcomes the undesirable characteristics discussed above. The transistors 150 are appropriately biased by steering current through a weak transistor 360, configured as a diode, to provide for maximum headroom, and the configuration effectively isolates each current source. However, the circuit of FIG. 3 requires the use of a second reference current source 315. As with the original current source 110, this second current source must be routed to each cascode biasing circuit. Being a current source, it must be routed via low impedance routes of metal, which introduces considerable complexity to the IC routing, and consumes considerable die area. Preferably, the additional reference current required for each cascode biasing circuit should be provided local to the region of each block, to eliminate the need for these long, area consuming, metal routes.

FIG. 4 shows a straightforward, but unreliable, modification to the cascode biasing circuit of FIG. 3. Transistors 440, 450, 470, and 480 operate to provide the equivalent current of current source 315 in FIG. 3. These four transistors would be located wit each cascode biasing circuit, eliminating the need for the additional metal routing discussed above. Although FIG. 4 eliminates the need for the second reference current source of FIG. 3, the circuit of FIG. 4 can be shown to have unreliable start-up characteristics. This circuit is bistable; it has an alternative steady state condition wherein no current flows. Upon entry to this state, for example when the device is first turned on, the circuit will remain in this state, providing no current to the remainder of the design.

SUMMARY OF THE INVENTION

This invention comprises a reliable cascode biasing scheme which provides maximum, rail to rail, headroom, and allows for locally generated voltages from a single reference current source. The disclosed design results in improved performance characteristics compared to traditional single reference current source designs, and a considerable die area reduction compared to traditional maximum headroom biasing designs which require two reference current sources.

The single reference current biasing is achieved by a start-up circuit which overcomes the undesirable no-current steady state condition exhibited by traditional attempts to bias a maximum headroom cascode biasing schemes from a single input current. The start-up circuit is extremely simple and does not counteract the die area advantage of cascode biasing schemes. The cascode biasing scheme presented herein also provides for high isolation of one derived current source from another, and is robust with regard to lot-to-lot IC process variations.

Also disclosed herein is a double sided cascode biasing circuit, enabling rail to rail operation for CMOS designs from a single reference current source.

DETAILED DESCRIPTION OF THE PREFERRED EMBODIMENT

The prior art cascoded biasing schemes are presented herein in detail, for completeness. For ease of understanding, they are described with respect to NMOS devices, relative to operation at the "lower" rail. The complementary operation of prior art devices, with respect to PMOS devices and the "upper" rail, will be evident to one versed in the art.

Figure 1:
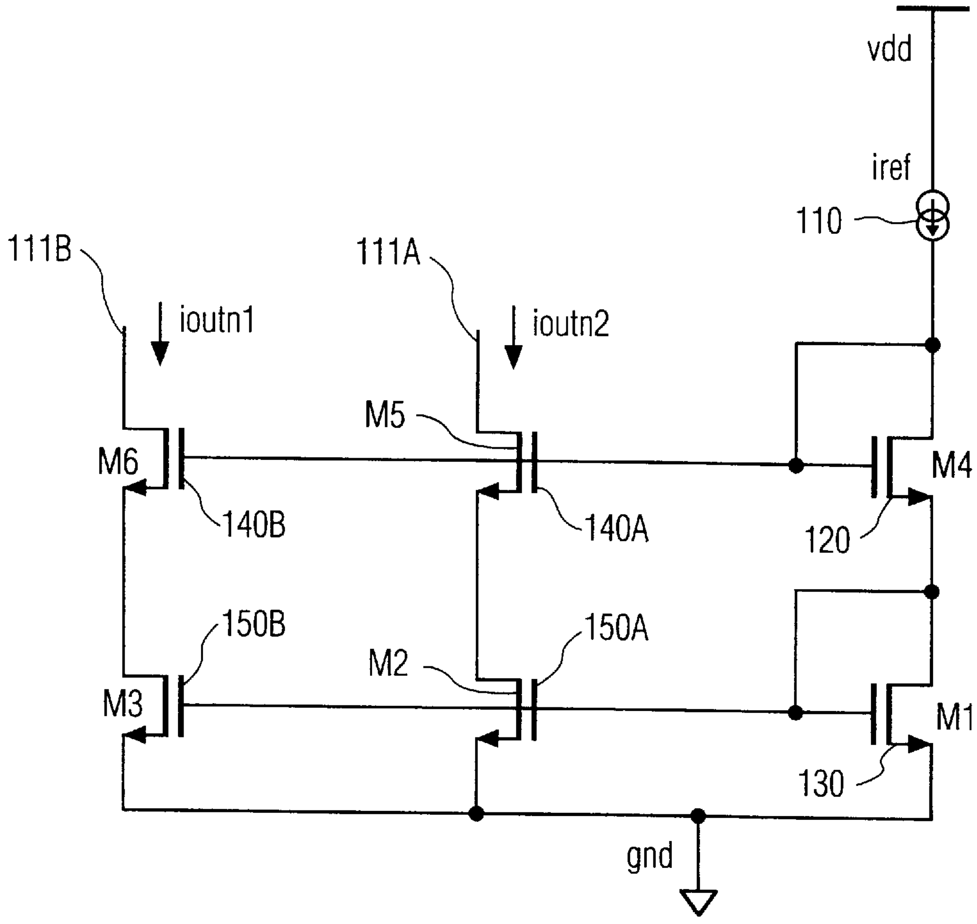
FIG. 1 PRIOR ART
FIG. 1 shows a traditional limited headroom, single reference current, cascode biasing circuit.

FIG. 1 shows a multi-output cascoded NMOS current mirror. The input current is $I_{ref}$, and the output currents are derived currents 111 (111A, 111B and so on). Each output current stage comprises a cascode transistor 140 and a current source transistor 150. FIG. 1 shows two output current stages, formed by 140A, 150A, and 140B, 150B, which produce the corresponding derived currents 111A, 111B. Typically, an output current stage (140x, 150x) would provide a derived current (111x) for each subcircuit (x) within a block. Within each output current stage, transistor 150 provides a constant current, while transistor 140 increases the output impedance of this constant current source. The input current $I_{ref}$ from reference current source 110 builds up a voltage across the two transistors 120 and 130, configured as diodes. The voltage across the drain and source of transistor 130 is used to set the current in all connected current source transistors 150, while the voltage across the drain and source of transistor 120 sets the biasing of the cascode transistors 140. As configured, the resultant voltage $V_{ds}$ across the current source devices 150 is:

$$V_{ds}=V_t+V_{dsat} \tag{1}$$

where $V_t$ is the threshold voltage of the transistors and $V_{dsat}$ is the saturation voltage. $V_t$ is typically in the order of 1 volt, and $V_{dsat}$ is typically about 0.3 volts.

The main drawback of the simple biasing scheme of FIG. 1, which follows directly from equation (1), is that the voltage across the current source devices is significantly higher than needed for their proper operation. In fact, since the minimum drain-source voltage $V_{ds}$ of a MOS current source is $V_{dsat}$, the voltage generated by the circuit is one threshold voltage, $V_t$, over the possible minimum. This excessive drain-source voltage reduces the headroom of the circuit that is being biased.

Figure 2:
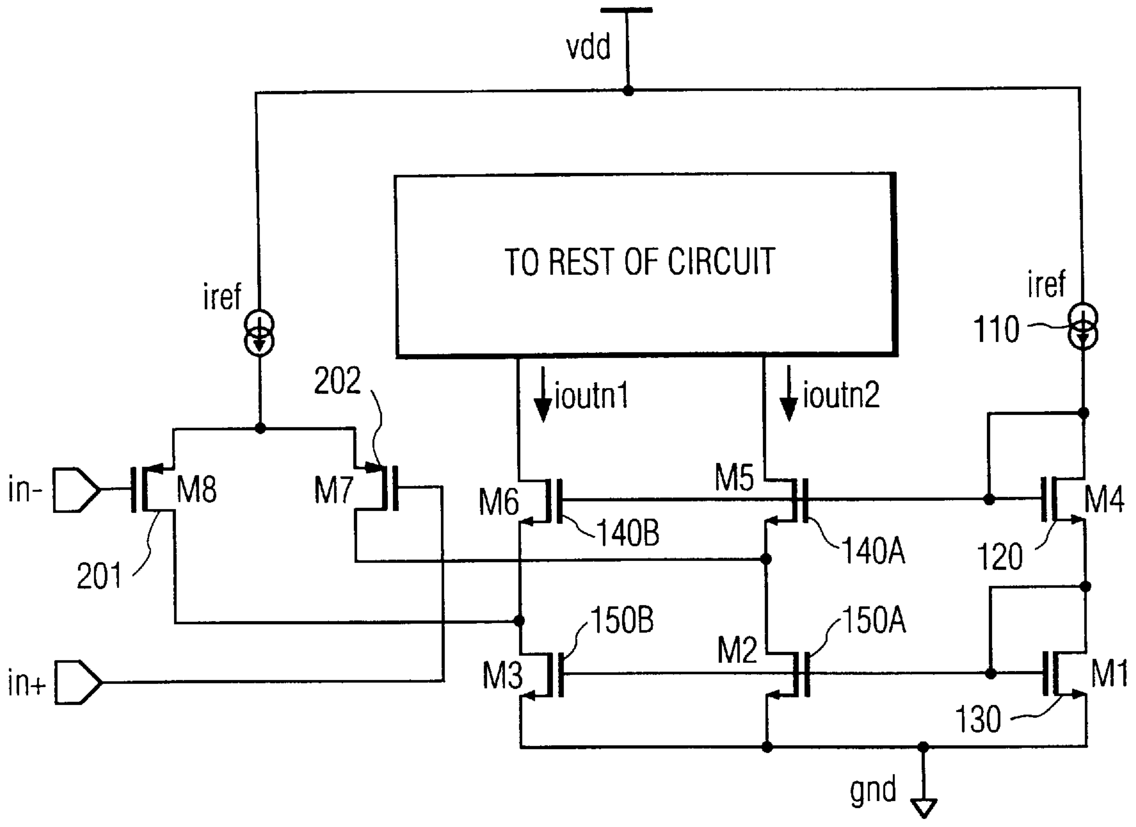
FIG. 2 PRIOR ART
FIG. 2 shows a traditional limited headroom input stage circuit.

One particular circuit type where this headroom reduction wreaks havoc is an input stage with an intended common-mode input voltage range that includes either one of the supply rails. An example is given in FIG. 2, which shows an PMOS input differential pair, 201 and 202, connected to the cascoded biasing scheme of FIG. 1 at the drains of 150B and 150A, respectively. The minimum input voltage $V_{in,min}$ of this circuit equals:

$$V_{in,min}=V_{dsat,nmos} \tag{2}$$

assuming that the NMOS and PMOS devices have identical threshold voltages. In other words, the input voltage range of the circuit of FIG. 2 remains separated from the negative supply rail by a saturation voltage $V_{dsat,nmos}$.

If, however, the cascode transistors 140 were biased such that the minimum required voltages $V_{dsat,nmos}$ would fall across the current source transistors 150, the minimum input voltage would extend down to:

$$V_{in,min}=-(V_t-V_{dsat,nmos}) \tag{3}$$

and would in most typical cases, where $V_{dsat,nmos}$ is less than $V_t$, include the negative rail with a comfortable margin. The circuit of FIG. 3, discussed subsequently, provides for this bias of cascode transistors 140, allowing $V_{in,min}$ to include the lower rail.

Another drawback of the circuit in FIG. 1 is its lack of isolation between the various current branches. Any voltage variation of each of these branches will reflect back onto the current of the other branches. This coupling originates from the drain-gate capacitances of the cascode transistors 140, which, through the two diodes 120 and 130, are in close connection to the gates of the current source transistors 150.

Figure 3:
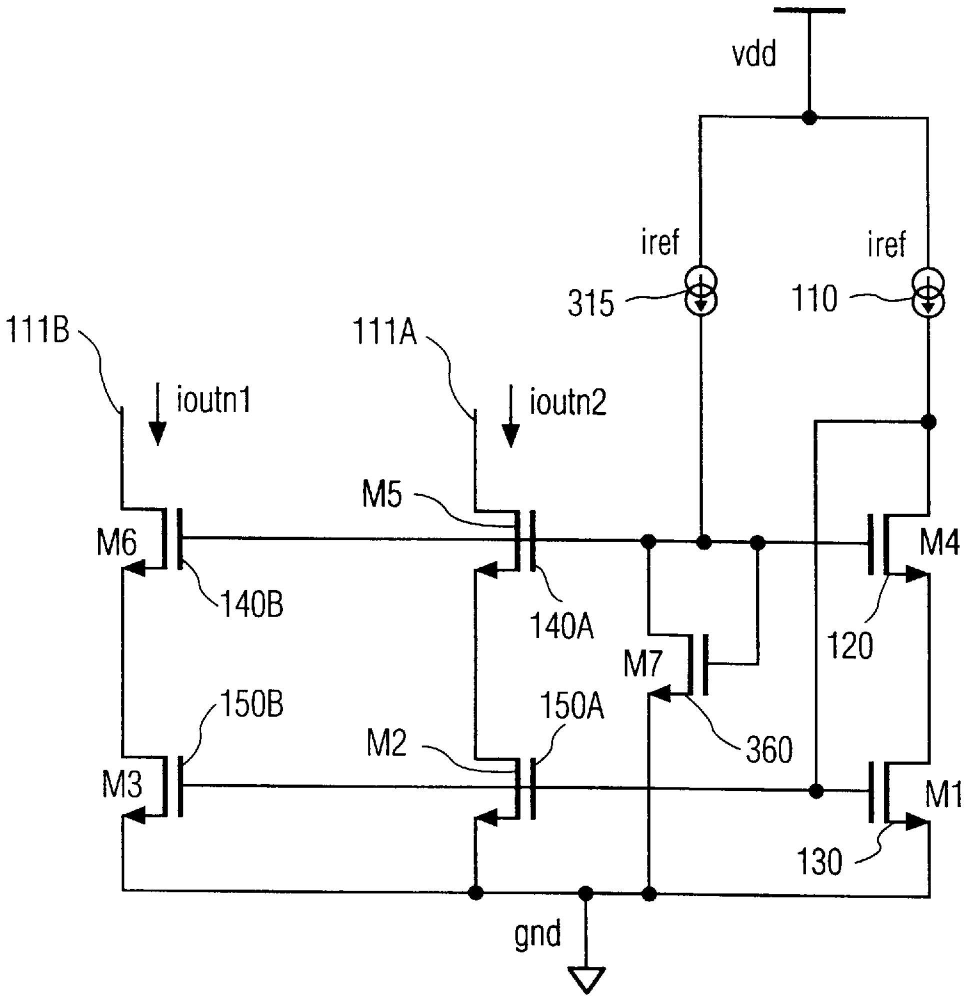
FIG. 3 PRIOR ART
FIG. 3 shows a traditional maximum headroom, dual reference current, cascode biasing circuit.

The circuit shown in FIG. 3 overcomes these objections. In FIG. 3, the gate voltage for the cascode transistors 140 is generated by steering a current through a weak NMOS diode, 360. If we assume the width to length (W/L) ratio of this device to be 1/r of the ratio of the other devices, the resulting drain-source voltage $V_{ds}$ across the current source transistors 150 will be:

$$V_{dsat,nmos}=(\sqrt{r}-1)V_{dsat,nmos}. \tag{4}$$

Choosing the value 4 for r results in a voltages exactly equal to the minimum required voltage $V_{dsat,nmos}$. Note that this voltage is independent from lot-to-lot process variations and temperature. It is only affected by the matching properties of the current source transistors 150, the cascode transistors 140, the diode 360 and the two reference currents $I_{ref1}$ and $I_{ref2}$. To guarantee operation even in worst-case mismatch situations, usually a ratio r of higher than 4, generally 5 to 6 is chosen. In case r=5, the resulting voltage across the current source devices is approximately 1.2 $V_{dsat}$. This is well low enough to ensure rail-to-rail operation of the input stage in FIG. 2. Furthermore, the various current branches have good isolation from each other; a voltage variation at the output of one current source will have little effect on the currents in the other branches.

Figure 4:
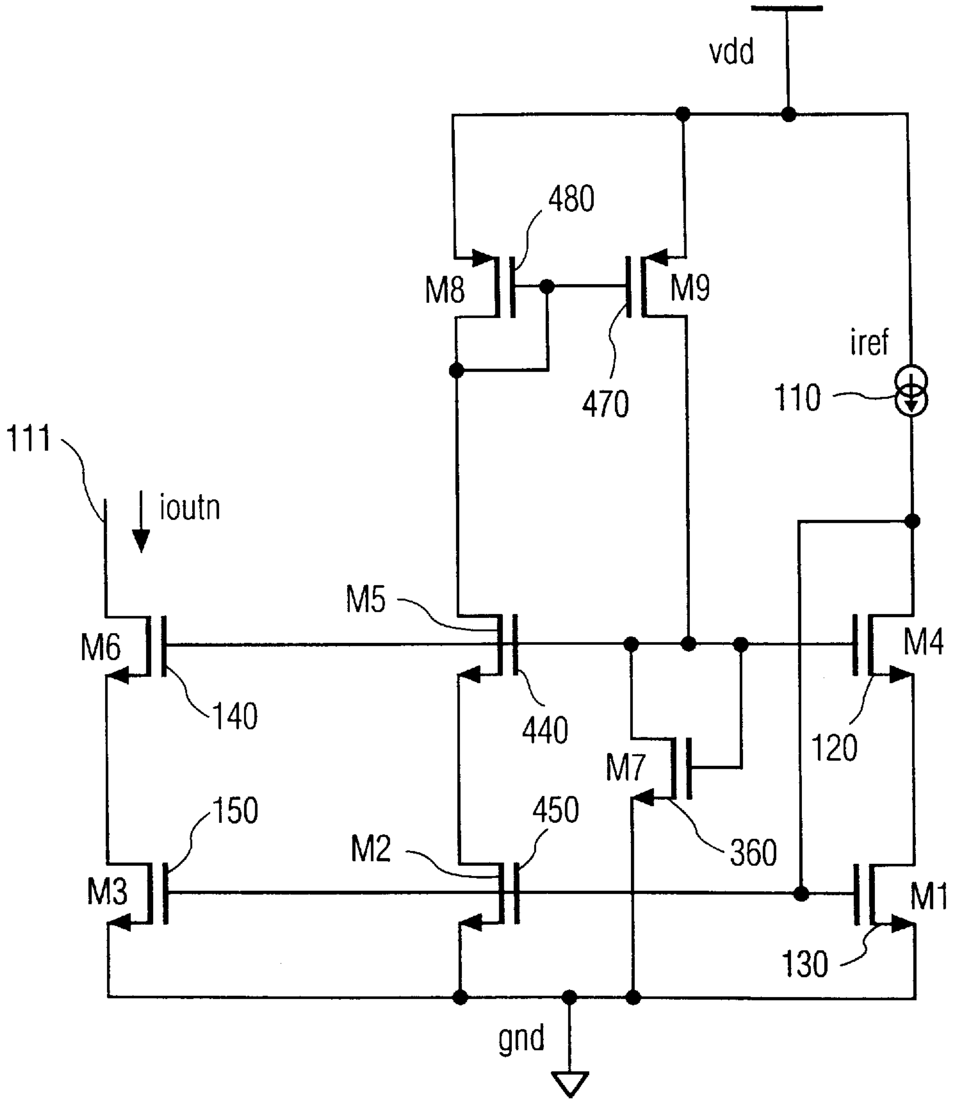
FIG. 4 PRIOR ART
FIG. 4 shows an unreliable maximum headroom, single reference current, cascode biasing circuit.

A disadvantage of the rail-to-rail biasing scheme of FIG. 3 is that it requires two incoming reference currents $I_{ref1}$ and $I_{ref2}$. Especially on large chips, the routing associated with the additional reference current yields a considerable die area penalty. It would be desirable to generate the additional current locally, eliminating the long, area consuming, metal running from the reference bias source to each circuit block to distribute the second current $I_{ref2}$. An attempt to do so is shown in FIG. 4. Here the only current input to the circuit block is $I_{ref}$, while the second current is generated by the PMOS current mirror 470 and 480, in conjunction with cascode transistor 440 and drive current transistor 450. Unfortunately, this set-up is not workable, because it had a second, zero-state, biasing solution. To understand this, assume that the voltage at the gates of the cascode transistor 440 is zero. In that case the cascode will be off and no current will be able to flow. The loop through the PMOS current mirror 470, 480 will also be current-less, failing to bring up the cascode transistor 440.

The circuit disclosed herein in accordance with this invention eliminates this zero-current steady-state solution in the circuit of FIG. 4 by providing a start-up path that is active under the zero-current condition. In order not to affect the biasing currents after start-up, it effectively eliminates itself from the circuit when in the normal operating mode. Additionally, the circuit is simple enough so as not to counteract the die area advantage of needing only one reference current branch. Furthermore it does not adversely affect the main virtues of the biasing scheme of FIG. 3: it is independent from process and temperature variations; it provides isolation among the derived current sources; and it provides for large headroom. The latter property is key in facilitating input stages that include the supply rails.

Figure 5:
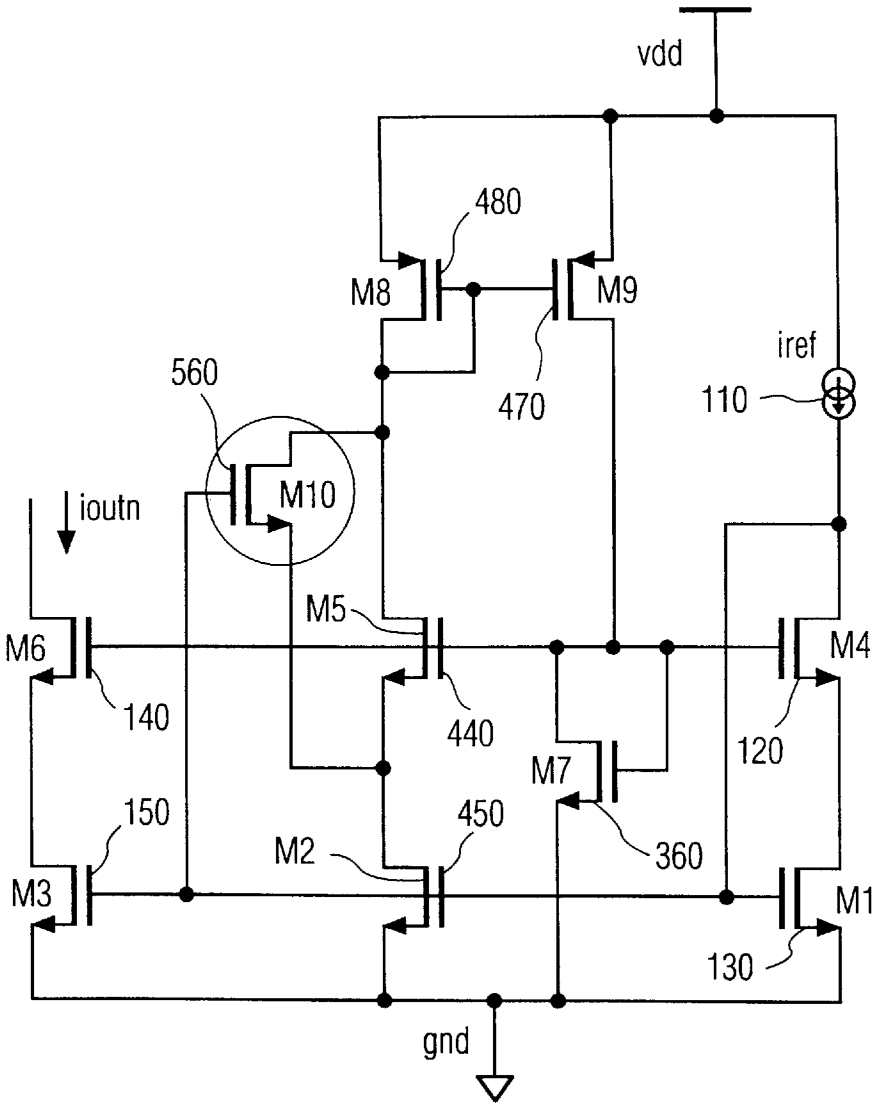
FIG. 5 shows a maximum headroom, single reference current, cascode biasing circuit in accordance with this invention.

FIG. 5, shows the proposed cascode start-up circuit in accordance with this invention. It comprises a minimum sized MOS transistor 560 connected across cascode 440. The gate of the start-up transistor 560 is connected to the gates of the current source device 450. It is easily verified that the additional transistor 560 will power-up the biasing scheme in case it inadvertently enters a zero-current mode state. Assume that the voltage at the gates of the cascodes 140, 440 is zero. In that case, no current will be able to flow in any of the current source branches, and the gate voltages of the current source devices 140, 450 will be pulled all the way up to the positive supply rail. In the absence of start-up device 560, the circuit will remain in this state, since no voltage will be built up across the diode 360 that supplies the bias voltage to the cascodes 140, 440. Since the gate of start-up device 560 is connected to the gates of the current source devices, it will be pulled to the supply rail along with the gates of the current sources. The resulting gate-source voltage of the start-up device will approximately equal the supply voltage:

$$V_{gs,start\text{-}up} \sim V_{dd}. \tag{5}$$

The start-up device will therefore turn on and bootstraps the bias circuit by providing a bypass for cascode 440. This enables a voltage to be generated across the cascode biasing diode 360 through the current mirror 470, 480. Only a small current through the start-up device 560 is needed to initiate the start-up. The small magnitude of the current, together with the high gate-source voltage given in equation 5, allows for a minimum sized transistor to implement the start-up device.

Once the cascodes gate voltages are high enough to turn the cascodes on, the bias circuit will enter its normal operation mode. In this situation, the gate-source voltage of the start-up device 560 will become smaller than the threshold voltage $V_t$ and the device will effectively disappear from the circuit. The gate-source voltage $V_{gs}$ of the start-up device 560 can be found from the steady state voltages of current source transistor 450. As discussed above, the drain-source voltage of current source transistor 450, per equation 4, with a width to length ratio, r, equal to 5, is:

$$V_{ds}=1.2\ V_{dsat}. \tag{6}$$

This is also the voltage at the source node of start-up device 560. The gate of current source 450, discussed above, is at $V_t+V_{dsat}$. This is also the voltage at the gate of start-up device 560. The gate-source voltage of the start-up device 560 during normal operation therefore equals:

$$V_{gs,normal}=V_t-0.2\ V_{dsat} \tag{7}$$

indicating that the device is off. Since the limiting case for the drain-source voltage of current source 450 is $V_{dsat}$, the gate-source voltage $V_{gs}$ of the start-up device will never exceed the threshold voltage $V_t$, guaranteeing that the start-up device is off once the circuit has started-up, independent of process and temperature. Note that even if there is some current leaking through the start-up device 560, this will not affect the biasing currents in the circuit. All the current generated by the current source 450 will flow either through the cascode 440 or the start-up device 560 and recombine at the common drain node of these transistors.

Figure 6A:
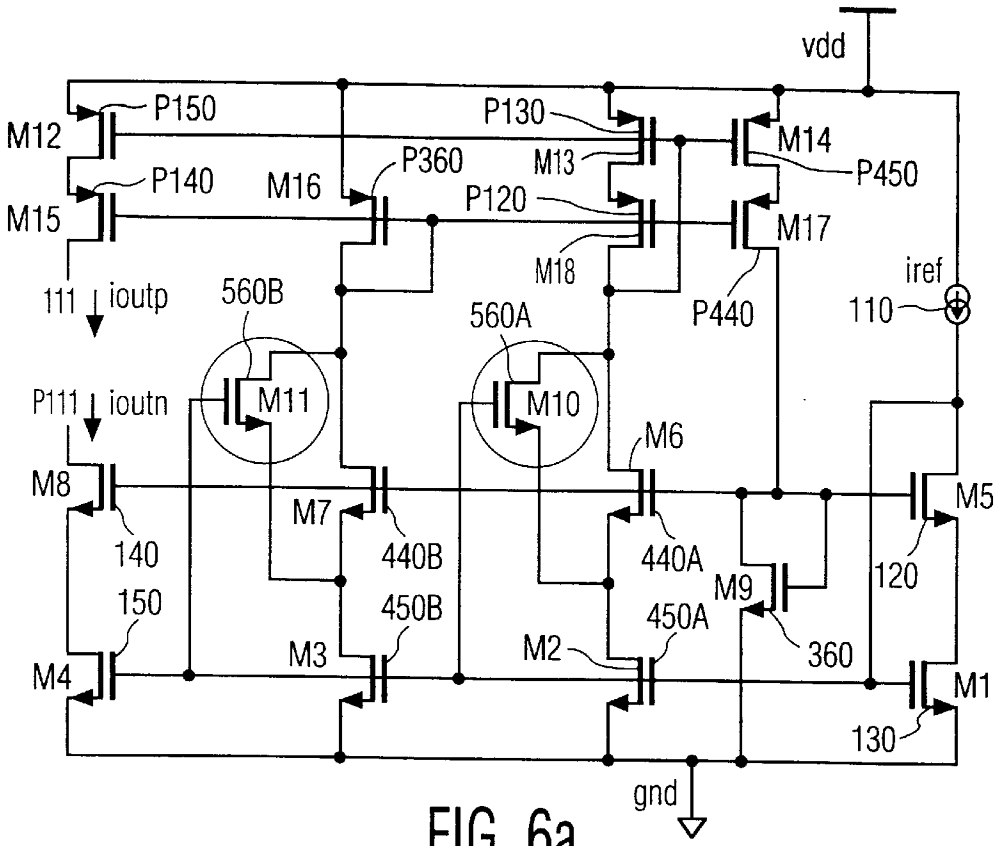
FIG. 6 shows two forms of a maximum headroom, single reference current, double sided cascode biasing circuit in accordance with this invention.
Figure 6B:
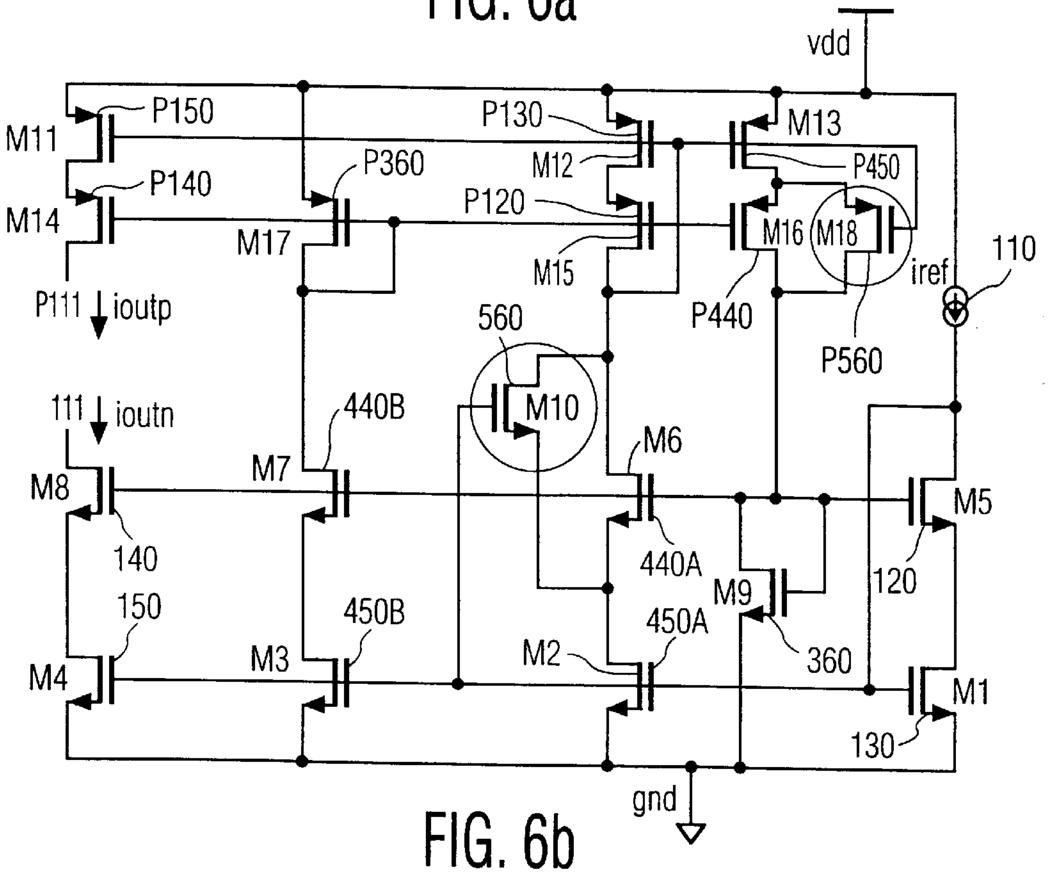

The start-up circuit can be extended to biasing schemes that incorporate cascoded current sources on both the NMOS and the PMOS side. In that case, two minimum sized start-up devices are required, as shown in FIGS. 6*a* and 6*b*. The PMOS transistors P120, P130, P140, P150, P360, P440, P450, and P560 perform the same function as their NMOS counterparts 120, 130, 140, 150, 360, 440, 450, and 560, as discussed above. Similar to NMOS transistor 360's function of enabling a connected input stage to operate down to and including the lower rail voltage, transistor P360 generates the PMOS cascode bias voltage which allows a connected input stage to operate up to and including the upper rail voltage. As in the NMOS case, if transistors P120, P140, P440 are initially in the non-conducting state, no current would flow sans the start-up transistor 560B in FIG. 6*a*, or start-up transistor P560 in FIG. 6*b*.

In FIG. 6*a*, the two NMOS transistors P560A, P560B are of minimum size, and provide the initial current conduction required to assure reliable start-up. The operation of each of these transistors is identical to that of start-up transistor 560, discussed above.

In FIG. 6*b*, one NMOS transistor 560 and one PMOS transistor P560 are used to provide the initial current conduction for reliable start-up. As discussed above, start-up transistor 560 will initially conduct, which in turn will cause P560 to conduct, eliminating the zero current state. Once conduction is started, the drain-source voltage of 450A will rise to a level sufficient to turn transistor 560 off. Similarly, the drain-source voltage of P450 will decrease to a level sufficient to turn transistor P560 off.

In both cases the resulting circuit has a single reference current input from which the four voltages are generated, at the drains of transistors 150, 140, P140, and P150, which can be used to bias both PMOS and NMOS cascoded current sources in a subsequent circuit. As discussed above, multiple subcircuits can be provided independent voltage and current sources by this circuit arrangement, by replicating transistors 150, 140, P140, and P150 for each of the independent subcircuits. Also as discussed above, the circuit shown in FIG. 6, excluding the reference current source 110, can be replicated for each block of circuitry within a design. The reference current source 110 need not be replicated; high conductivity routing would be utilized to supply the reference current from this current source to each of the replicated circuits within each block. Thus, in accordance with this invention, independent voltage and current distribution can be provided throughout the IC, from a single reference current source.

The foregoing merely illustrates the principles of the invention. It will thus be appreciated that those skilled in the art will be able to devise various arrangements which, although not explicitly described or shown herein, embody the principles of the invention and are thus within its spirit and scope.

I claim:

1. A circuit for distributing voltages and currents to one or more subcircuits, from a supply voltage source and a reference current source, said supply voltage having a lower rail voltage and an upper rail voltage, comprising:

means for providing a first derived voltage which is at or less than the lower rail voltage, means for providing a second derived voltage which is higher than said first derived voltage, means for providing a derived current which is substantially independent of any other current source, and, a start-up circuit, wherein said start-up circuit provides a conduction current when the supply voltage and reference current sources are first applied, and subsequently reduce said conduction current to substantially zero, characterized in that only one reference current source is utilized.

2. An improved rail-to-rail cascode biasing circuit which operates from a single reference current source, wherein said improvement comprises:

a start-up circuit, wherein said start-up circuit is configured to provide an initial conduction current to produce a non-zero current flow within said biasing circuit, and also configured to reduce this initial conduction current to substantially zero once said non-zero current flow is achieved.

3. An improved rail-to-rail cascode biasing circuit as in claim 2, wherein said start-up circuit consists of one NMOS transistor.

4. An improved rail-to-rail cascode biasing circuit as in claim 2, wherein said start-up circuit consists of two NMOS transistors.

5. An improved rail-to-rail cascode biasing circuit as in claim 2, wherein said start-up circuit consists of one NMOS transistor and one PMOS transistor.

6. A circuit for distributing current from a single reference current source, said circuit having a reference current input node for receiving said current from the reference current source, and having one or more current output nodes for supplying current, said circuit comprising:

a drive current transistor (450), a cascode transistor (440), one or more output current stages (140, 150)

a current mirror (470,480), a diode (360), a current setting transistor (130), a cascode biasing transistor (120), and, a start-up transistor (360), wherein:

each of said transistors have a drain, a source, and a gate, each of said output current stages having a current gate input, a cascode gate input, a source node, and one or more derived current outputs corresponding to said circuit's current output nodes, the diode has a drain and a source, the current mirror has an input and an output, each of said transistors are characterized as having a saturation impedance, said diode having a characteristic impedance which is at least four times the saturation impedance of each of said drive current transistor and cascode transistor, said gate of the cascode transistor being connected to the drain of the diode, the gate of the cascode biasing transistor, the output of the current mirror, and to the cascode gate input of each of the output current stages, said gate of the drive current transistor being connected to the gate of the start-up transistor, the gate of the current setting transistor, the reference current input node, the drain of the cascode biasing transistor, and to the current gate input of each of the output current stages, said drain of the drive current transistor being connected to the source of the cascode transistor, and the source of the start-up transistor, said drain of the cascode transistor being connected to said drain of the start-up transistor, and to the input of the current mirror, said drain of the current setting transistor being connected to the source of the cascode biasing transistor, and said source of the current setting transistor being connected to the source of the drive current transistor, and the source node of the output current stage.

* * * * *